United States Patent
Mailho et al.

[11] Patent Number: 6,118,100
[45] Date of Patent: Sep. 12, 2000

[54] SUSCEPTOR HOLD-DOWN MECHANISM

[75] Inventors: Robert D. Mailho, Sonora; Dean M. Dumitrescu, Pleasant Hill; Joseph H. MacLeish, San Ramon; Mahesh K. Sanganeria, Sunnyvale, all of Calif.

[73] Assignee: Mattson Technology, Inc., Fremont, Calif.

[21] Appl. No.: 09/348,788

[22] Filed: Jul. 7, 1999

Related U.S. Application Data

[63] Continuation of application No. 08/979,741, Nov. 26, 1997, abandoned.

[51] Int. Cl.⁷ ........................................................ F27B 5/14
[52] U.S. Cl. .......................... 219/390; 219/634; 118/728; 118/730
[58] Field of Search ..................................... 219/390, 405, 219/411, 634, 649, 652; 392/416, 418; 118/724, 725, 728, 730, 50.1

[56] References Cited

U.S. PATENT DOCUMENTS

| | | | |
|---|---|---|---|
| 4,846,102 | 7/1989 | Ozias et al. | 118/730 |
| 5,044,315 | 9/1991 | Ozias et al. | 427/719 |
| 5,096,534 | 3/1992 | Ozias et al. | 156/611 |
| 5,117,769 | 6/1992 | DeBoer et al. | 118/666 |
| 5,198,034 | 3/1993 | DeBoer et al. | 118/725 |
| 5,244,694 | 9/1993 | Ozias et al. | |
| 5,427,620 | 6/1995 | DeBoer et al. | 118/725 |
| 5,580,388 | 12/1996 | Moore et al. | 118/728 |
| 5,688,331 | 11/1997 | Aruga et al. | 118/725 |
| 5,695,568 | 12/1997 | Sinha et al. | 118/729 |
| 5,800,686 | 9/1998 | Littau et al. | 204/298 |

*Primary Examiner*—Teresa Walberg
*Assistant Examiner*—Shawntina Fuqua
*Attorney, Agent, or Firm*—Skjerven, Morrill, MacPherson, Franklin & Friel LLP; Tom Chen

[57] ABSTRACT

A structure and method for holding a susceptor in a single-wafer RF heated CVD reactor allows the center portion of the susceptor to be heated and prevents susceptor and reactor damage due to overdriving and the susceptor from losing contact with a rotatable rod during thermal expansion. A plug, located on the bottom surface of the susceptor, heated by RF energy subsequently heats the center portion of the susceptor, thereby providing constant temperature gradients across the susceptor. The plug is connected to a rod which is contained in an upper tube and extends into a lower tube. The upper tube is connected to the susceptor via a locking mechanism. An upper spring in the upper tube applies a downward force on the upper tube such that an upward force on the bottom of the susceptor compresses the upper spring, thereby relieving stress on the susceptor and preventing damage due to overdriving. A lower spring is provided within a lower tube connected to the rod such that the lower spring forces the rod upward to keep continual contact with the plug during various times of thermal expansion. The two springs also allow easy removal and assembly of the susceptor and rod structure for cleaning and repair.

18 Claims, 5 Drawing Sheets

SUSCEPTOR HOLD-DOWN MECHANISM

This application is a continuation of U.S. application Ser. No. 08/979,741, filed Nov. 26, 1997, now abandoned.

BACKGROUND

1. Field of Invention

The present invention relates to susceptors and to structures for supporting susceptors in chemical vapor deposition (CVD) reactors, and more particularly, to such susceptors and structures for use in single-wafer RF-heated reactors.

2. Description of Related Art

In conventional silicon wafer processing, multiple silicon wafers are placed onto a susceptor within a chemical vapor deposition (CVD) reaction chamber for heating and processing. However, because of increased wafer sizes, i.e., up to 12 inches in diameter, a recent trend has been to process these wafers individually using single-wafer CVD reactors. Such reactors also greatly reduce the time necessary to heat the wafer to the processing temperature.

In processing a wafer, it is desirable to deposit uniform film layers onto the wafer, which requires the wafer be uniformly heated and maintained at a uniform temperature. One method of heating the wafer is through the use of heat sources, such as high intensity heat lamps, positioned external to the reaction chamber. Large amounts of energy from these lamps radiantly heat the wafer and a susceptor on which the wafer lies. The lamps can be placed at locations to provide uniform heating and constant temperature gradients across the wafer. However, in these types of systems, the lamps also heat the walls of the reactor chamber, which causes process gases to deposit on the walls as well as on the silicon wafer. The resultant film formed on the chamber walls absorbs some of the radiant energy emitted from the heating lamps and thereby locally increases the temperature of the chamber walls. As a result, process gases deposit on the chamber walls at an increasing rate. Therefore, the chamber walls must be carefully etched or cleaned, sometimes after every run. Yet, even if cleaned after a single run, film deposition on the chamber walls may still affect the temperature uniformity within the run.

Another method for heating a wafer in single-wafer CVD reactors, which overcomes the problems associated with radiant energy techniques, uses radio frequency (RF) as the heat source. In such systems, RF induction coils may be positioned, for example, underneath a susceptor holding the wafer. The susceptor, typically made of silicon carbide-coated graphite, absorbs energy from the RF coils, thereby heating the susceptor. This heat energy is then transferred by the susceptor to the wafer to bring the wafer to the desired processing temperature, with the amount of heat transfer dependent on both the emissivity and conductivity of the susceptor. Therefore, in contrast to prior methods, the heat transferred to the wafer is independent of the thickness of deposited layers formed on the chamber walls. Commonly-owned U.S. Pat. No. 5,653,721, entitled "GAS INJECTION SYSTEM FOR CVD REACTORS", describes such a single-wafer RF heated CVD reactor and is incorporated herein by reference in its entirety.

The above-described RF heated CVD system decreases the effect of silicon layer formation on chamber walls. However, with systems using RF energy, the RF energy, from the coils for example, exerts a lifting force on the susceptor. This force can be greater than 40 pounds, which may result in the lifting and disengaging of the susceptor from its moorings during the heating process.

Furthermore, a system where a wafer is cooled through heat transfer from the wafer to a susceptor to a heat sink, such as the one incorporated by reference above, can be improved by increasing wafer cooling efficiency. For example, a system may include RF coils housed in a quartz structure with a silicon carbide plate on top of the housing and below the susceptor. After the heating process, water running through the RF coils cools the coils, which in turn cools the silicon carbide plate. This plate acts as a heat sink for the susceptor to facilitate the cooling phase in the CVD process. To effectively utilize the heat sink, the susceptor must be brought in contact with the silicon carbide plate. Without contact, heat transfer is substantially reduced. However, if the plate and susceptor are forced together after initial contact, i.e., overdriven, either or both may break due to the brittle nature of silicon carbide. As a result, a very precise and controlled movement is required for cooling the wafer without damaging reactor components.

Yet another shortcoming of a single-wafer RF heated system is that of temperature uniformity across the center of the wafer. Because no magnetic field lines exist at the center of the RF coils, the center of the susceptor is not heated, which results in the center of the wafer not being adequately heated. This problem does not arise with other types of systems. For example, with batch reactors processing multiple wafers, the middle of the susceptor is not crucial since the wafers lie outside the susceptor center, and with single-wafer reactors using radiant energy, the wafer heating is direct so that no dead zone exists in the center of either the wafer or susceptor.

Accordingly, a structure is desired which overcomes the problems discussed above with respect to a single-wafer reactor using RF energy heating.

SUMMARY

According to the present invention, a susceptor and rod assembly is provided which includes a susceptor portion and a rod portion, which rotates the susceptor portion. The susceptor portion includes a plug that is heated by RF coils underneath the susceptor. The plug then conductively transfers heat to the center portion of the susceptor, which heats the center of a wafer. The rod portion includes various locking mechanisms and springs to securely hold the susceptor, while still having the ability to relieve any undesired force between the susceptor and the underlying structures. The present invention also allows easy assembly and reassembly of the susceptor and rod portions.

The susceptor portion includes a susceptor, a locking mechanism, and a heating plug. The rod portion includes an upper and a lower quartz tube, an inner quartz rod within both upper and lower tubes, and a connecting plug joining the inner rod with the lower tube. The susceptor portion is connected both to the upper tube, by another locking mechanism attached to the upper tube, and to the inner rod, by a fitted recess and protrusion at the respective ends of the heating plug and rod. Springs within the upper and lower tubes compress to relieve stress from overdriving and thermal expansion, respectively.

In one embodiment, the susceptor and heating plug are formed from a single piece of silicon carbidecoated graphite. The heating plug intercepts RF field lines from RF induction coils beneath the susceptor, thereby heating the plug, which in turn heats the center of the susceptor. As a result, no cold zone exists at the center of the susceptor as with conventional single-wafer RF heated systems.

The plug fits into the end of a rotatable quartz rod and within an upper quartz tube. A locking mechanism on the susceptor and upper quartz tube, such as a recess-and-ear configuration, connects these structures, with a spring providing the necessary tension to secure the two locking mechanisms together. This spring, located between a circular outer ridge on the rod and a circular inner ridge at the end of the upper tube, further allows overdriving the susceptor into a silicon carbide plate located directly below the susceptor. Stress between the plate and susceptor is somewhat relieved when the spring compresses due to the susceptor and plate being driven together after initial contact. Without a way to relieve this stress, either or both structures may crack or break due to their brittle nature.

Another spring, within the lower tube, is positioned between the connecting plug and a ridge within the inner portion of the lower tube. Two pins are formed on the inner portion above this ridge. These pins slide into grooves in the connecting plug and are secured through tension provided by the spring. The connecting plug attaches to the quartz rod, thereby connecting the upper and lower portions of the susceptor and rod assembly. Once assembled, the susceptor rotates via a drive motor, which connects to and drives the lower tube. At the end of the lower tube, a polished quartz window allows IR or other temperature sensors to measure temperature changes in the middle of the susceptor.

The present invention allows the further advantage of easy susceptor and rod assembly removal and disassembly for cleaning and servicing. The assembly is then easily reassembled and replaced for further use.

This invention will be more fully understood in light of the following detailed description taken together with the accompanying drawings.

BRIEF DESCRIPTION OF THE DRAWINGS

Use of the same reference numbers in different figures indicates similar or like elements.

DETAILED DESCRIPTION

Figure 1:
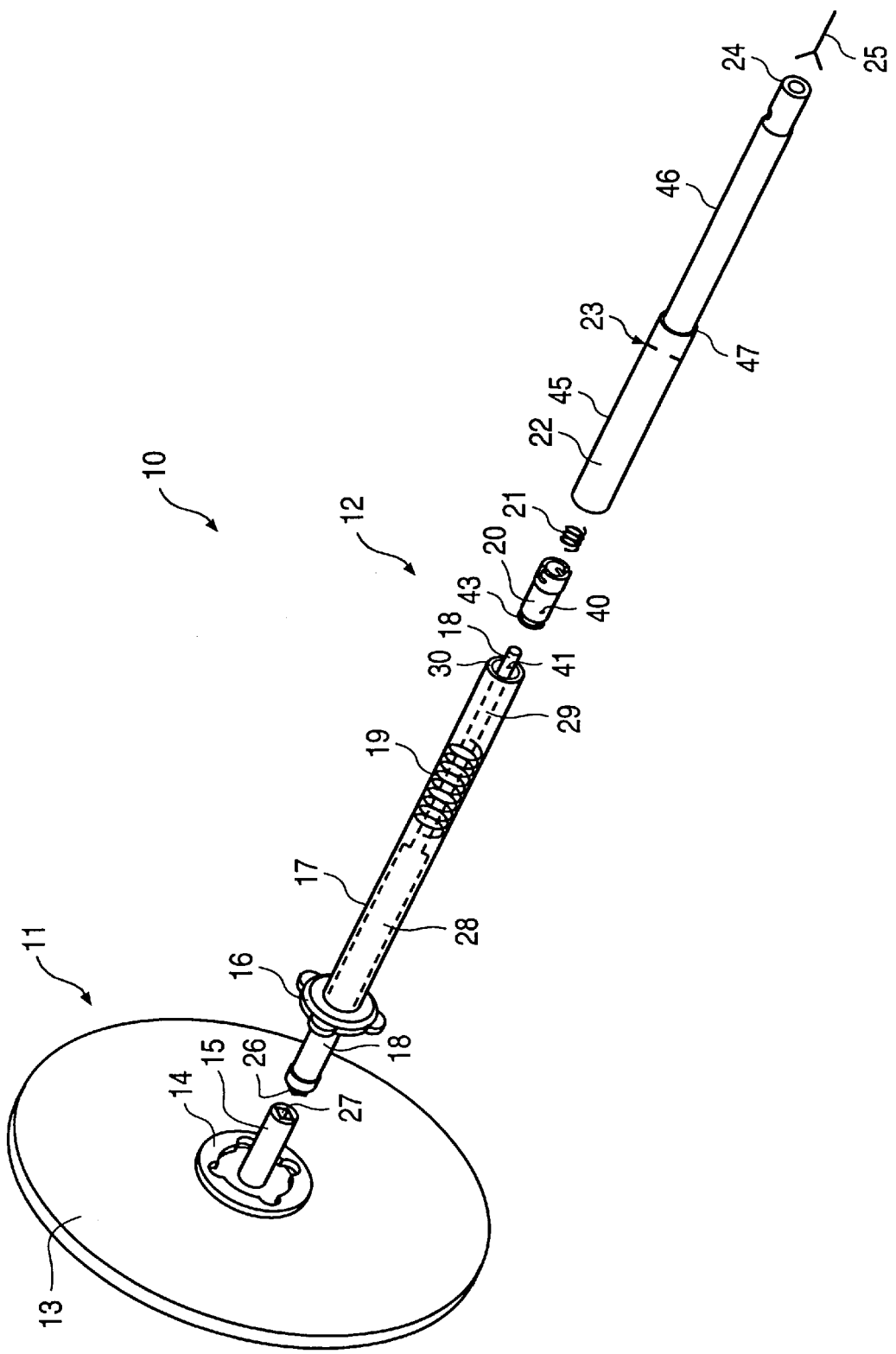
FIG. 1 is an exploded view of a susceptor and rod assembly according to one embodiment of the present invention.

FIG. 1 shows a susceptor and rod assembly 10 according to one embodiment of the present invention, which includes a susceptor portion 11 and a rod portion 12, which rotates susceptor portion 11. Susceptor portion 11 comprises a susceptor 13, a first locking mechanism 14 and a heating plug 15, preferably made of silicon carbide-coated graphite or solid silicon carbide. Elements 13–15 can be a unitary structure formed by machining a single piece of material or a composite of individual elements formed separately and then assembled. Rod portion 12 includes an upper quartz tube 17 connected to susceptor portion 13 and a lower rotatable quartz tube 22 connected to upper quartz tube 17. Upper quartz tube 17 is secured to a second locking mechanism 16, which fits into first locking mechanism 14, and contains a slidable and rotatable quartz rod 18, an upper spring 19, and a connecting plug 20 attached to rod 18. Lower quartz tube 22 connects to rod 18 via connecting plug 20 and a lower spring 21. Rod 18, which slides and rotates within upper tube 17 and lower tube 22, is a unitary quartz structure with two distinct portions 28 and 29, with the thicker portion 28 being closer to susceptor 13. Upper tube 17 has an inner lip 30 at the lower end of upper tube 17 such that upper spring 19, surrounding thinner portion 29, is held between inner lip 30 and the edge separating rod portions 28 and 29.

Figure 2A:
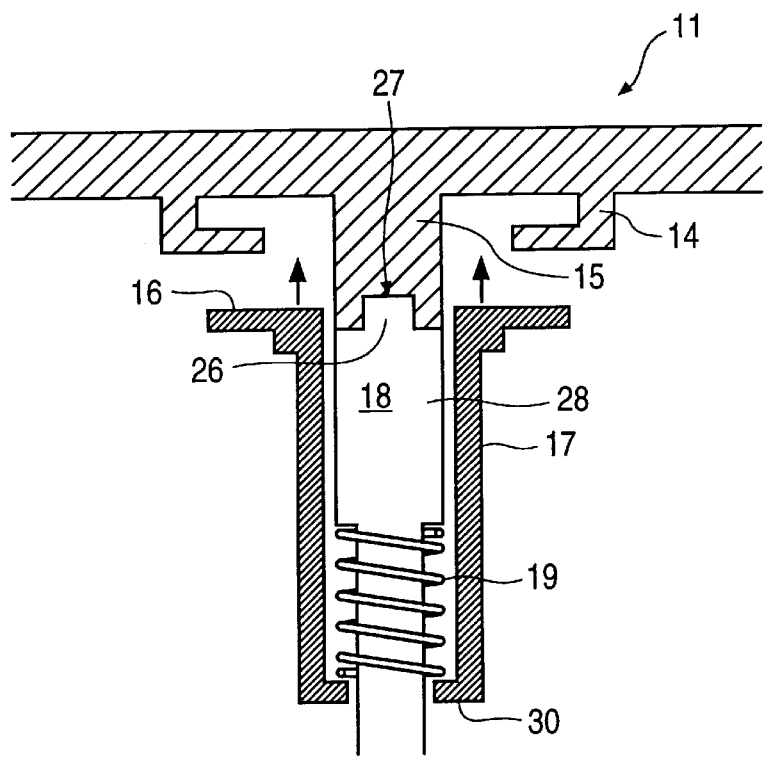
FIGS. 2A and 2B are sectional views of connections for the susceptor and upper tube and for the rod and lower tube, respectively, of the assembly of FIG. 1.

As shown in FIG. 2A, susceptor portion 11 and upper tube 17 are connected by first pulling susceptor portion 11 and upper tube 17 together and inserting a protrusion 26 of rod 18 into a matching recess 27 in plug 15, thereby compressing upper spring 19 between thicker portion 28 and inner lip 30. Locking mechanisms 14 and 16 are then pulled together to insert the notches of 16 into the matching recesses of 14. Rotating upper tube 17 or susceptor portion 11, which turns locking mechanism 16 or 14, respectively, secures the two locking mechanisms together and "locks" upper tube 17 into susceptor portion 11, with compressed upper spring 19 providing the force necessary to keep the locking mechanisms secure. Although shown as clover-leaf shaped, any suitable locking mechanism may be used. Similarly, although protrusion 26 and recess 27 for plug 15 and rod 18, respectively, are shown as square-shaped, any non-circular shape may be used.

Figure 2B:
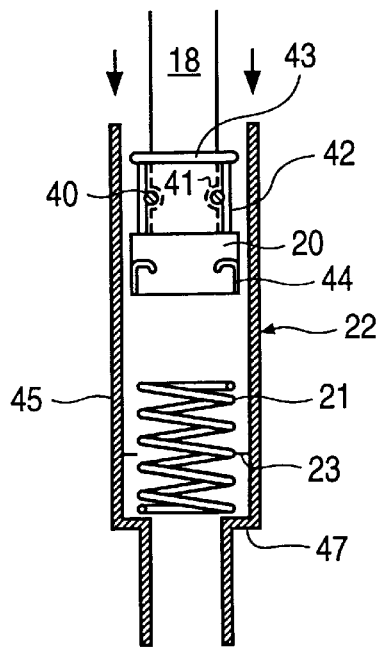
Figure 3:
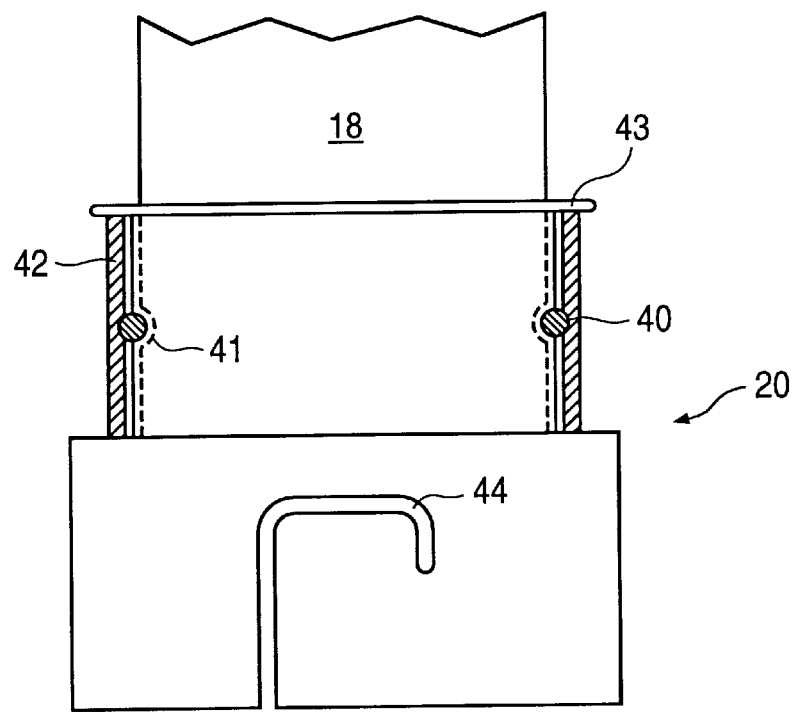
FIG. 3 is side view of connecting plug 20.

Rod 18 is connected to lower tube 22 via connecting plug 20 as shown in FIG. 2B. Referring to also to FIG. 3, connecting plug 20 is first attached to rod 18 by sliding plug 20 over the end of rod 18, where the inner diameter of plug 20 is slightly larger than the outer diameter of rod 18. Two ball bearings 40 extending through the thinner upper portion of plug 20 fit into two matching recesses 41 in quartz rod 18 to secure connecting plug 20 to rod 18. A sleeve 42 fits around the thinner upper portion of connecting plug 20 to hold ball bearings 40 in recesses 41. An O-ring 43 located at the top of connecting plug 20 prevents sleeve 42 from slipping from connecting plug 20 onto rod 18. Once secured to rod 18, connecting plug 20 attaches to lower tube 22 via two fish-hook shaped grooves 44, as described below. It should be noted that the above-described structure and method of securing connecting plug 20 to rod 18 are not essential to this invention. Rather, any quartz rod structure having a connecting portion with grooves similar to those shown in FIG. 3 is suitable.

Figure 4:
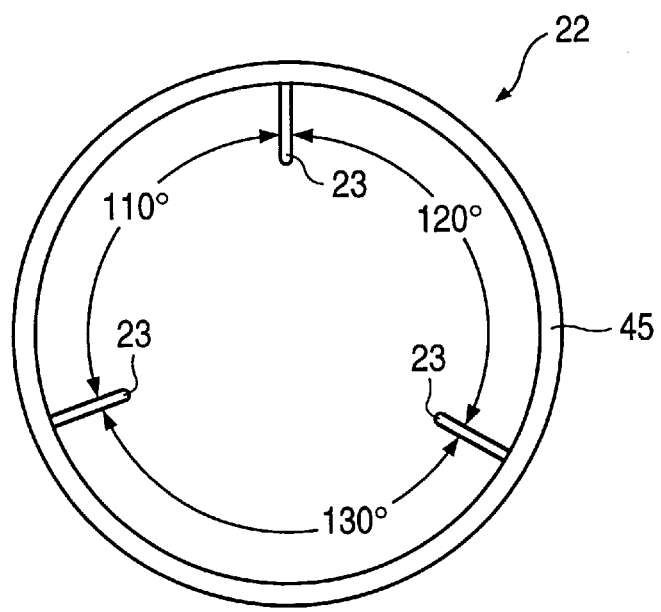
FIG. 4 is an end view of lower tube 22, showing placement of pins 23.
Figure 5:
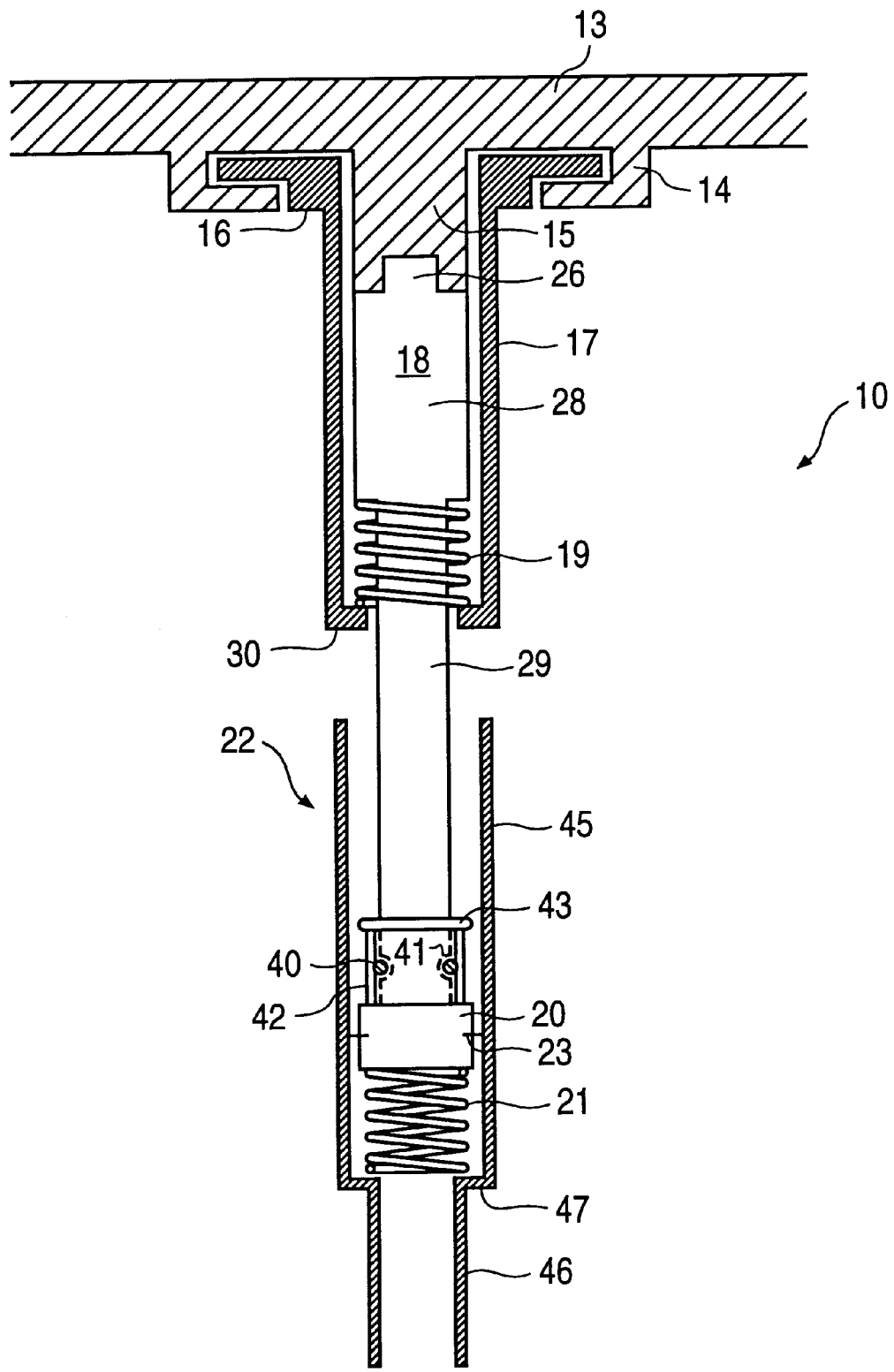
FIG. 5 is a sectional view of the assembled susceptor and rod assembly of FIG. 1.

Quartz rod 18 is then inserted into lower tube 22 such that two pins 23, located 150° apart on the interior of an upper portion 45 of lower tube 22 (as shown in FIG. 4), slide into grooves 44 of connecting plug 20, thereby compressing lower spring 21 between connecting plug 20 and a ridge 47 separating a smaller diameter lower portion 46 from upper portion 45. Lower tube 22 is then rotated to slide pins 23 toward the hook portions of grooves 44, at which point lower spring 21 forces pins 23 into the hook portions of grooves 44 to secure lower tube 22 to connecting plug 20. FIG. 5 shows the assembled susceptor and rod assembly 10. Because lower tube 22 is attached (via plug 20) to quartz rod 18, which is attached to susceptor portion 11, an electrically controllable drive motor (not shown) coupled to lower quartz tube 22 can rotate susceptor 13 for wafer processing.

Figure 6:
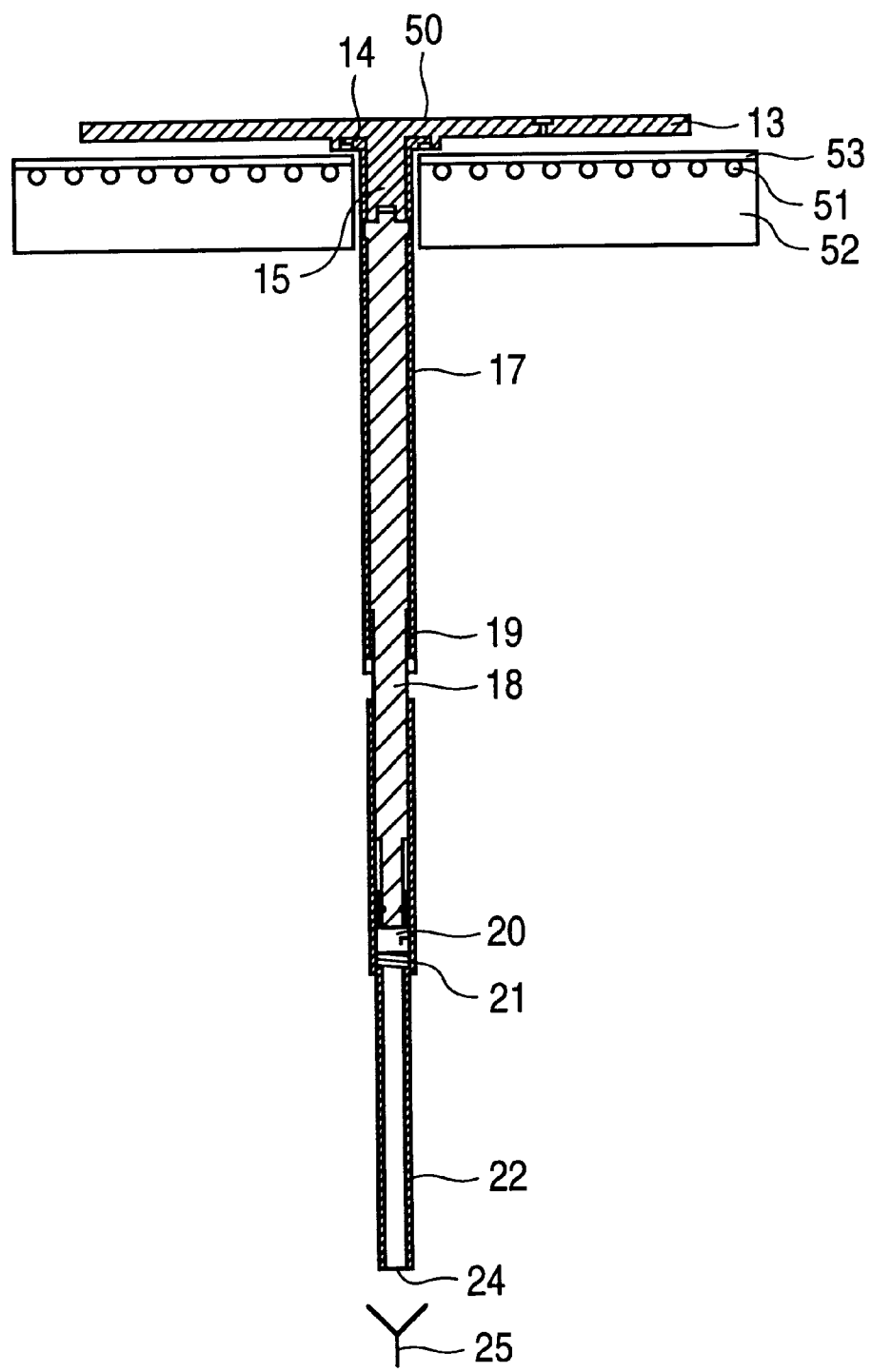
FIG. 6 is a sectional view of the susceptor and rod assembly of FIG. 5 along with an RF heating source.

FIG. 6 shows assembled susceptor and rod assembly 10 with RF induction coils 51 contained within a quartz housing 52 to heat susceptor 13 via a silicon carbide plate 53 located underneath susceptor 13. Susceptor 13 holds a silicon wafer 50 for processing. RF coils 51 generate magnetic field lines which heat susceptor 13 through silicon carbide plate 53. An electric field is created as excited electrons oscillate back and forth along coils 51. Heating plug 15, preferably made of silicon carbide-coated graphite, intercepts these electric field lines. As a result, the silicon carbide, and thus plug 15, is heated. The heat from plug 15 is then conductively transferred to first locking mechanism 14 and to the center of susceptor 13 to heat the center of susceptor 13.

Without heating plug 15, the center of susceptor 13 would not be heated because RF coils 51 do not generate field lines underneath the center of susceptor 13 to heat that area directly, resulting in a "dead" or cold zone at the center of susceptor 13. While the rest of susceptor 13 is being heated by the RF coils to a processing temperature, e.g., 1150° C., this cold zone can be as low as 40–50° C., which is enough to crack the susceptor due to the large temperature gradients. Heating plug 15 placed through the center of coils 51 couples with the generated RF field, which allows plug 15 to be heated and that heat to be transferred to the center of susceptor 13. The amount of heat transferred to susceptor 13 is dependent upon the size of heating plug 15 and the distance between coils 51 and heating plug 15. In general, the closer coils 51 are to heating plug 15, the more heat is generated due to a more efficient coupling with the electric field. Furthermore, by increasing the size (length and/or diameter) of heating plug 15, more heat is generated and thereby transferred. In the present embodiment, heating plug 15 is approximately ½ inch in diameter and ¾ to 1¼ inches long. However, the amount of heat transferred to susceptor 13 has a greater dependence on the distance between coils 51 and heating plug 15 than the size of heating plug 15.

Referring back to FIGS. 1 and 6, a polished quartz window 24 at the end of lower tube 22 allows an IR sensor 25 to measure temperature variations at the center of susceptor 13. Quartz rod 18 is optically polished at both ends to allow light to be transferred from the center of susceptor 13 to sensor 25 for energy and temperature measurements. Sensor 25 can be a contactless fibroptic IR sensor commercially available from LAND Corporation of Bristol, Pennsylvania, although any suitable sensor may be used.

Another advantage of this invention is that the susceptor is securely attached to the rod assembly to counteract any RF lifting force from the coils which may act to dislodge the susceptor. For example, a 250 kW generator operating at 50 kHz creates an RF lifting force greater than 40 lbs. As a result, this force can dislodge an unsecured or lightly-held susceptor from its support. One solution is to reduce the lifting force by increasing the RF generator frequency, e.g., at 180 kHz, the lifting force drops to approximately one pound. The problem is that current high power solid state generators are limited to frequencies below 80 kHz because these systems use solid state IGBT devices. For systems operating above 80 kHz, prices for suitable generators can be doubled, thereby making them cost prohibitive.

The present invention uses clover-leaf shaped locking mechanisms 14 and 16 (or other similar recess-and-ear structures) to secure susceptor 13 to rod portion 12 and uses upper spring 19 to provide tension for keeping the two locking mechanisms together. In this manner, susceptor 13 is securely attached to prevent dislodging from an RF lifting force generated by the coils underneath. In addition, susceptor 13 can be easily removed from upper quartz tube 17 by simply pushing susceptor 13 and upper tube 14 together to compress upper spring 19 and then turning one of the two locking mechanisms to release the susceptor.

Upper spring 19, preferably made of stainless steel, provides a further advantage of preventing damage to susceptor 13 and/or silicon carbide plate 53 due to overdriving. Susceptor 13 is brought into contact with silicon carbide plate 53 to facilitate wafer and susceptor cooling. However, because susceptor 13 and silicon carbide plate 53 are very brittle with little or no give, any overdriving of the two can cause either or both structures to crack or break. In the present embodiment, upper spring 19 compresses to relieve some of the stress induced by overdriving. In FIG. 5, if susceptor 13 or silicon carbide plate 53 is driven past the point of initial contact, upper spring 19 compresses, either from susceptor 13 and upper tube 17 lifting up or from rod 18 pressing down. As a result, upper spring 19 relieves some of the strain between susceptor 13 and silicon carbide plate 53, which allows some overdriving without damage to either structure. The spring coefficient should be high enough for the spring to support the susceptor portion, yet not so high that the spring is unable to relieve the desired stress from expected overdriving forces.

In the figures, silicon carbide plate 53 is shown as a planar plate, which has a disadvantage of less efficient cooling because only a small portion of susceptor 13 is in contact with plate 53 acting as a heat sink. However, by decreasing the thickness of locking mechanisms 14 and 16, which decreases the distance between silicon carbide plate 53 and susceptor 13, cooling efficiency can be increased even without the rest of susceptor 13 touching plate 53. If maximum cooling efficiency is desired, plate 53 can be manufactured to contour the bottom of susceptor 13, i.e., a planar plate with a circular recess in the middle, so that a maximum amount of surface area contact occurs between plate 53 and susceptor 13. Thus, depending on system requirements, silicon carbide plate 53 can be planar, which is less costly and simpler to make, or contoured, which allows for increased cooling efficiency.

Yet another advantage to the structure of the present invention is the ability to compensate for different thermal coefficients of expansion between adjacent elements. In FIGS. 2 and 6, as the susceptor portion heats up, susceptor 13 and heating plug 15 expand away from quartz rod 18 because of their different thermal expansion coefficients. As a result, heating plug 15 begins to move away from quartz rod 18. However, lower spring 21 expands to force quartz rod 18 against heating plug 15, thereby providing the force necessary to keep quartz rod 18 and heating plug 15 secured together. Without this spring force, the susceptor portion may move up and down during heating and cooling periods, periodically separating from quartz rod 18.

In addition, lower spring 21, along with connecting plug 20, allows susceptor and rod assembly 10 to be quickly disassembled and removed for servicing and then reassembled for use. Referring to FIGS. 1-6, the structure comprising susceptor portion 11, upper tube 17, and rod 18 can be separated from lower tube 22 by pushing down, turning, and lifting up on the structure, thereby disengaging pins 23 from connecting plug 20. The structure can then be easily removed from the top of the CVD system and replaced in the same position due to the location of pins 23 and grooves 44. By placing pins 23 and grooves 44 in asymmetric positions, i.e., 150° apart, the structure containing the susceptor and wafer can only be replaced in one position, thereby maintaining a consistent spatial orientation. Susceptor portion 11 can be detached by pulling down on upper tube 18 and turning to release locking mechanisms 14 and 16. After servicing or cleaning, susceptor and rod assembly 10 can be easily reassembled for use. Consequently, the structure of this invention overcomes the problems discussed above with respect to single-wafer RF heated reactors as well as provides additional advantages as described herein.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as fall within the true spirit and scope of this invention.

We claim:

1. A susceptor and rod structure, comprising:
   a susceptor;
   a heating plug extending from the bottom surface of said susceptor to heat the center portion of said susceptor;
   a rod portion connected to said susceptor: and
   a first spring located within said rod portion, wherein said first spring compresses as force is applied to the bottom surface of said susceptor.

2. The structure of claim 1, wherein said heating plug is made of graphite coated with silicon carbide.

3. The structure of claim 1, further comprising a locking mechanism for connecting said susceptor to said rod portion.

4. The structure of claim 3, wherein said heating plug, said susceptor, and said locking mechanism form a unitary structure.

5. The structure of claim 1, wherein said rod portion comprises a rotatable rod contained within an upper tube, said upper tube connected to said susceptor and said rod connected to said heating plug.

6. The structure of claim 5, wherein said first spring is located within said upper tube.

7. The structure of claim 6, wherein said rod comprises a ridge separating a thicker upper portion and a thinner lower portion of said rod, and wherein said first spring is located between said ridge and a bottom portion of said upper tube.

8. The structure of claim 7, further comprising a lower tube, wherein the lower portion of said rod portion extends into said lower tube.

9. The structure of claim 5, further comprising a connecting plug to connect said lower tube to said rod and a second spring located between said connecting plug and an inner surface of said lower tube, wherein said second spring expands to force said rod toward said susceptor.

10. The structure of claim 9, further comprising pins located within said lower tube, said pins fitting into grooves on said connecting plug to connect said connecting plug to said lower tube.

11. The structure of claim 10, wherein the angular separation between said pins is unequal.

12. The structure of claim 11, wherein the angular separation between two adjacent said pins is 150°.

13. The structure of claim 5, wherein said rod is made of quartz, and wherein the ends of said rod are optically polished.

14. A susceptor and rod structure, comprising:
    a susceptor;
    a heating plug extending from the middle portion of said susceptor;
    a first spring-loaded connector underneath said susceptor to allow for pressure against the bottom surface of said susceptor; and
    a second spring-loaded connector underneath said heating plug to allow for thermal expansion of said heating plug.

15. A susceptor and rod structure, comprising:
    a susceptor;
    a heating plug extending from the middle portion of said susceptor;
    an upper tube coupled to said susceptor;
    a rod coupling said susceptor to a lower tube;
    a first spring located in said upper tube applying a downward force on said upper tube; and
    a second spring located in said lower tube applying an upward force on said rod.

16. A method of heating the center portion of a susceptor, comprising:
    heating a plug located below said center portion of said susceptor;
    releasing force applied to said center portion of said susceptor from thermal expansion of said plug; and
    transferring the heat from said plug conductively to the center portion of said susceptor.

17. The method of claim 16, wherein said plug is silicon carbide-coated graphite.

18. The method of claim 16, wherein said plug and said susceptor form a unitary structure.

* * * * *